United States Patent [19]

Hassan et al.

[11] 4,348,139

[45] Sep. 7, 1982

[54] GAS FILM WAFER TRANSPORTATION SYSTEM

[75] Inventors: Javathu K. Hassan, Hopewell Junction; John A. Paivanas, Hyde Park, both of N.Y.

[73] Assignee: International Business Machines Corp., Armonk, N.Y.

[21] Appl. No.: 145,156

[22] Filed: Apr. 30, 1980

[51] Int. Cl.³ .............................................. B65G 51/02
[52] U.S. Cl. ...................................... 406/10; 406/52; 406/73; 406/84; 406/88
[58] Field of Search ..................... 406/10, 52, 72, 73, 406/76, 84, 86, 87, 88; 198/592, 631

[56] References Cited

U.S. PATENT DOCUMENTS

| | | | |
|---|---|---|---|
| 3,588,176 | 6/1971 | Byrne et al. | 406/84 |
| 3,622,151 | 11/1971 | Range et al. | 406/87 |
| 3,812,947 | 5/1974 | Nygaard | 406/88 X |
| 3,976,330 | 8/1976 | Babinski et al. | 406/84 |
| 4,014,428 | 3/1977 | Ossbahr | 198/592 X |
| 4,081,201 | 3/1978 | Hassan et al. | 406/88 |
| 4,165,132 | 8/1979 | Hassan et al. | 406/10 |

FOREIGN PATENT DOCUMENTS

| | | | |
|---|---|---|---|
| 268144 | 1/1969 | Austria | 198/592 |
| 2801624 | 8/1978 | Fed. Rep. of Germany | 406/84 |

OTHER PUBLICATIONS

IBM Technical Disclosure Bulletin; vol. 11, No. 7; pp. 757–758; Dec. 1968; "Two Chamber Air to Vacuum Lock System"; by Barber.

Solid State Technology; Apr. 1980; pp. 148–155; "A New Air Film Technique for Low Contact Handling of Silcon Wafers", by Paivanas & Hassan.

Primary Examiner—Jeffrey V. Nase
Attorney, Agent, or Firm—Edward W. Brown

[57] ABSTRACT

A manufacturing processing system comprises a plurality of processing stations, preferably vacuum stations, interconnected by air track, preferably an axi-radial air track with novel sections rotatable about a transverse axis in the plane of the track and normal to the travel of the objects, hereafter referred to as swivelators. Certain of the swivelators are formed with axial movable portions capable of moving beyond the plane of the air track surface and returning to the plane, so that these swivelators can pick up and set down objects in predetermined positions in the manufacturing processing station with an air force so as to not make physical contact with the objects. A novel gas lock device is positioned in the air track between those processing stations, in which the gas pressure must be separated so as to essentially eliminate the possibility of gas contaminant passing from one station to the next. The gas lock comprises an air track compartment having closable sides or panels in the path of the travel of the object being transported along the air track.

6 Claims, 15 Drawing Figures

FIG. 3b     FIG. 3a
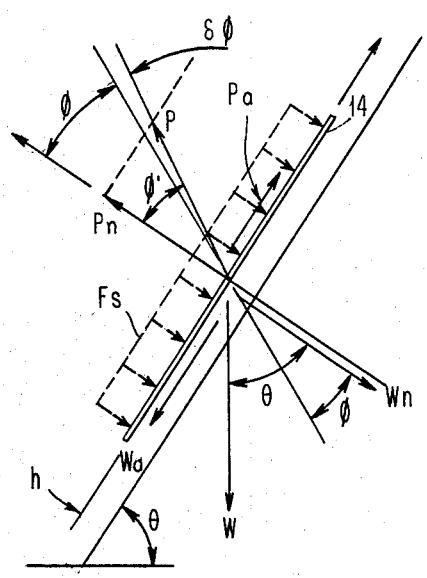
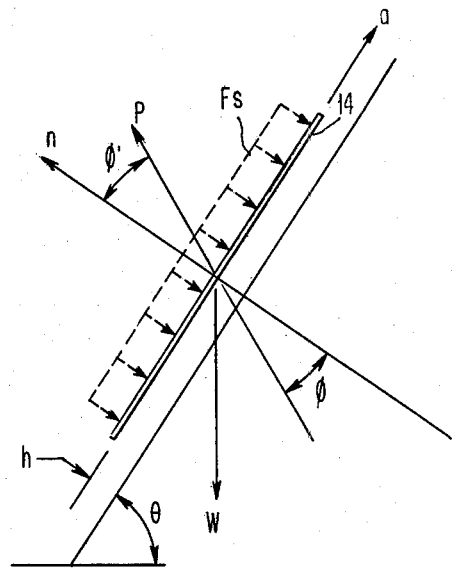
FIG. 4a
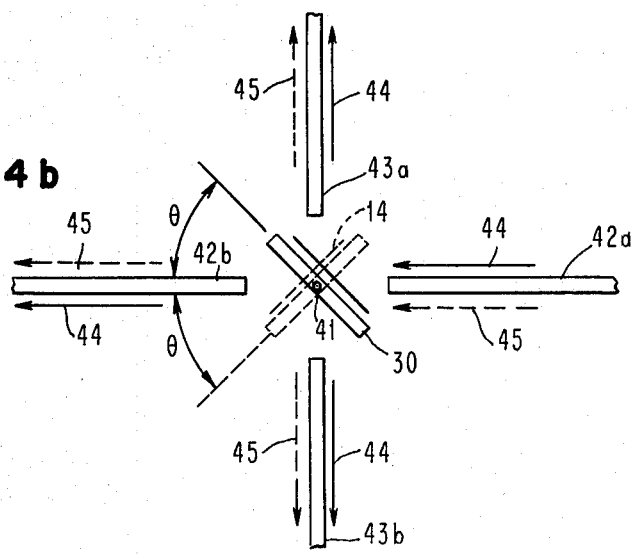
FIG. 4b

4,348,139

GAS FILM WAFER TRANSPORTATION SYSTEM

BACKGROUND OF THE INVENTION

Field of the Invention

This invention relates to the transportation of objects, such as semiconductor wafers along a track on a film of air, and more particularly, to a manufacturing processing system and method in which a air track is used to transport objects to and from processing stations, including vacuum stations, at different elevations.

Previously, objects such as semiconductor wafers, which are subsequently divided into semiconductor chips, have been moved along a track on an air film during non-vacuum processing and testing of the semiconductor wafers. Mechanical robots have been used to pick the wafers off of the air track and dip them into, for example, a resist development solution. However, the most recently projected future semiconductor manufacturing processes employ techniques which permit very large scale integration (VLSI) of semiconductor chips or, in other words, a vast increase in the number of circuits per chip. Such techniques are E-beam lithography, dry or plasma etching, and ion implantation, all of which require a vacuum environment. In addition, semiconductors have been manufactured for a number of years using other vacuum techniques, such as vacuum deposition, sputtering, and sputter etching. The present trend is towards a "total vacuum" manufacturing process due to the demanding fabrication requirements and tighter tolerance controls to achieve reasonable yield levels of the VLSI devices. Yield levels are directly coupled to and critically dependent on stringent defect and contamination controls, which by definition must minimize or effectively eliminate human contact throughout the complete fabrication of the semiconductor wafer. The manufacturing process of high yield VLSI semiconductor chips must be a continuous wafer manufacturing system, preferably a "total vacuum" system to which an enclosed air film wafer transportation system is highly suited, such as described in U.S. Pat. No. 4,081,201 and 4,165,132, assigned to the same assignee. However, to be completely functional, such as air film transportation system must be such that mechanical robots are no longer necessary to change the elevation and angular orientation of the wafer because of potential damage to the wafer when it is gripped with the mechanical fingers of the robots. In other words, the air film transportation system must be able to perform these functions.

SUMMARY OF THE INVENTION

Therefore, it is a primary object of the present invention to provide an air film transportation system and method which is capable of moving objects, such as semiconductor wafers, to and from manufacturing process stations, including vacuum stations, without mechanical robots.

Another object of the present invention is to provide an air film transportation system and method which is capable of moving objects in other than a horizontal plane.

A like object of the present invention is to provide an air film transportation system and method capable of moving objects to different elevations and into and out of any angular orientation.

A further object of the present invention is to provide an air film transportation system and method which permits objects to be moved into and out of different gas and vacuum environments and yet allows the objects to only be exposed to the environment of the particular processing station.

An additional object of the present invention is to provide a novel section of air track which is capable of changing the angular orientation of the moving objects, such as semiconductor wafers.

A still additional object of the present invention is to provide certain novel sections of air track which is capable of not only changing the angular orientation of the moving object, but of being separated from the air track and being able to set down objects into a manufacturing station and to pick up objects out of a manufacturing station, without physically contacting the objects.

To achieve the foregoing objects in accordance with the present invention, a manufacturing processing system comprises a plurality of processing stations, preferably vacuum stations, interconnected by air track, preferably an axi-radial air track with novel sections rotatable about a transverse axis in the plane of the track and normal to the travel of the objects, hereafter referred to as swivelators. In operation of the manufacturing system, the object coming from a manufacturing station is stopped on the swivelator adjacent non-horizontal portion of the air track. The swivelator is rotated to a position so as to place it at the same non-horizontal angle as the air track. The object is then moved up or down the air track to another swivelator at the other end of the non-horizontal portion of the air track and this swivelator is rotated to a position so as to place it in the same horizontal position as the air track thereby changing the elevation of the object so that it can be transported to the next manufacturing station. In the method of the present invention, the steps of the method comprise: transporting an object from a first manufacturing processing station on a first horizontal air track to an inclined section of air track, rotating a section of air track at the inclined section with the object thereon to be aligned with the inclined section, transporting the object along the inclined section to the other end, rotating a section of air track at the other end with the object thereon to align the section with a second horizontal section at an elevation different from the first horizontal air track, and transporting the object on the second horizontal air track to a second manufacturing processing station.

In accordance with another aspect of the present invention, certain of the swivelators are formed with axial movable portions capable of moving beyond the plane of the air track surface and returning to the plane, so that these swivelators can pick up and set down objects in predetermined positions in the manufacturing processing station with an air force so as to not make physical contact with the objects. Preferably, these swivelators are removable from the air track by an extended pivotable mechanical arm so as to permit greater flexibility in transporting the object to the predetermined position.

A further aspect of the present invention is a novel gas lock device positioned in the air track between those processing stations, in which the gas pressure must be separated so as to essentially eliminate the possibility of gas contaminant passing from one station to the next. The gas lock comprises an air track compartment having closable sides or panels in the path of the travel of the object being transported along the air track so that the object, after leaving one processing station can be transported into the gas lock compartment through an open side or panel, the other sides or panels being closed. When the object is in the compartment, its movement is stopped and the open panel is closed. In this gas lock position, the gas and thereby contaminants present from the previous processing station are exhausted or flushed from the compartment. This is followed by supplying gas of the gas environment of the next station and opening a side or panel, such as the panel on the opposite side, to that next station. Of course, the object does not have to be transported in the same direction to the next station and the gas lock compartment also can serve as a direction orientating section of the air track so as to be able to move the object in a different direction. In addition, either in combination with a direction orientating section or separately, the gas lock compartment also can function as the previously described swivelator.

BRIEF DESCRIPTION OF THE DRAWINGS

The invention and further advantages thereof will be best understood by reference to the following detailed description of illustrative embodiments taken in conjunction with the accompanying drawings in which:

FIG. 3a is a diagrammatic sketch of the resultant forces acting on wafer motion on an inclined axi-radial air track;

FIG. 3b is a diagrammatical sketch of the constituent force components acting on wafer motion on an inclined axi-radial air track;

FIG. 4a is a side view of the swivelator of the present invention rotatable about a center axis and shown in the horizontal, vertical and upside down positions;

FIG. 4b is a side view of an embodiment of the swivelator of the present invention rotatable about a center axis;

DETAILED DESCRIPTION OF A PREFERRED EMBODIMENT

Figure 1:
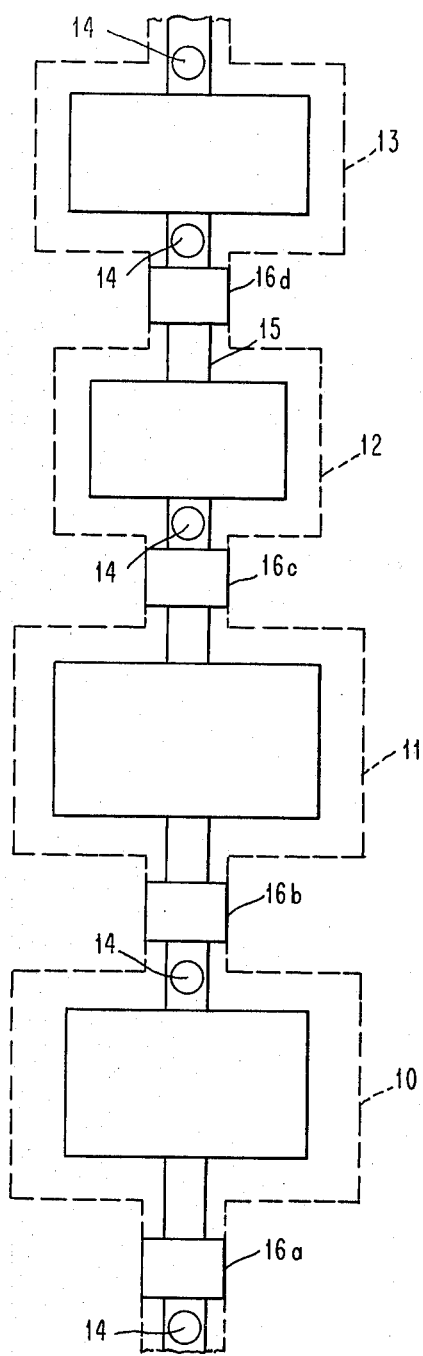
FIG. 1 is a schematic representation of a partial semiconductor manufacturing processing line employing the air film transportation system and gas locks of the present invention.

Referring to FIG. 1, there is shown four sequential manufacturing processing stations, herein semiconductor vacuum processing stations 10, 11, 12, 13, to which objects, herein semiconductor wafers 14 are transported on an air track 15, after being flushed of contaminants in gas locks 16a, 16b, 16c, 16d. The semiconductor wafers 14 carrying a resist layer are transported from gas lock 16a to station 10 in which they are exposed to an E-beam pattern, after which the wafers are transported from station 10 and through gas lock 16b to station 11 where the pattern is developed by dry plasma etching. Next, the wafers are transported from station 11 through gas lock 16c and to station 12 where a layer is deposited in the non-resist areas by either sputtering or evaporation. Portions of these layers are etched away by reactive ion etching in station 13 after being transported there through gas lock 16d from the last station 12. While only four semiconductor processing stations have been shown in FIG. 1, it is well known in the art how to manufacture semiconductor wafers using stations 10, 11, 12, 13, which are also well known in the art. Because different gases are present at these stations, gas locks 16a-d in accordance with one aspect of the present invention, are positioned in the path of the wafers. This aspect of the present invention will be described in more detail in reference to FIGS. 10a and 10b.

Figure 2:
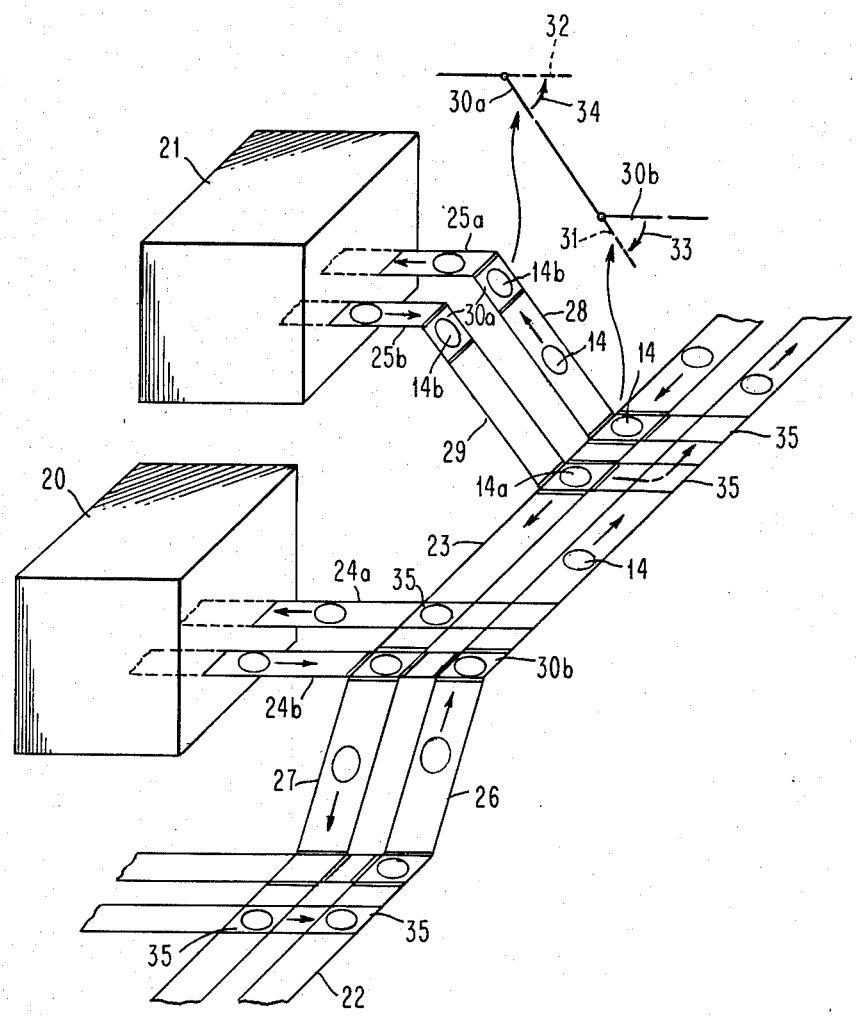
FIG. 2 is a schematic representation of a partial semiconductor manufacturing processing line employing the air film transportation system with the swivelators of the present invention.

As shown in FIG. 1, the air track 15 is depicted as being in a horizontal plane, which is not true in a practical environment. In such an environment, in order to be able to transport the wafers to and from the semiconductor processing stations 10, 11, 12, 13, the air track must be capable of moving the wafers up and down an incline as shown in FIG. 2 and into and out of different position orientations as shown in FIG. 4. Turning first to FIG. 2, there is shown two semiconductor processing stations 20 and 21. Two main parallel air tracks 22 and 23 transport the wafers 14 to and from two pairs of connecting air tracks, 24a, 24b and 25a, 25b which move the wafers 14 to and from the stations 20 and 21, which are physically at different elevations relative to each other and both are at a different elevation relative to at least one previous station (not shown). Air tracks 24a, 25a are constructed to move the wafers to the stations 20, 21, and air track 24a, 24b is constructed to move the wafers from the stations or in the opposite direction.

Air tracks 22, 23, 25a and 25b are formed with inclined sections 26, 27, 28 and 29, sections 26, 28 for moving the wafers up the incline and sections 27, 29 for moving the wafers down the incline. In accordance with the present invention, a movable section having means for rotating the section about an axis perpendicular to the path of the objects, herein wafers, is disposed adjacent each end of the inclined sections 26, 27, 28 and 29. This movable section will hereafter be referred to as a swivelator 30, which functions to either transpose a wafer 14a from its horizontal position on the air track to the angular position of the inclined sections, or transpose a wafer 14b from its angular position on the incline sections of the air track to the horizontal position of the air track. Preferably, the swivelator 30 is formed with a hinge at one of its ends at the point of transportation between the horizontal section and the inclined section of the air track. In this preferred embodiment, the swivelator can either be part of the inclined section of air track in its normal position as shown by swivelators 30a. or be part of the horizontal air track as shown by swivelators 30b. The transposed positions of the swivelators 30a and swivelators 30b is shown by the dash lines 31, 32 as indicated by the arrows 33, 34 in the diagram in FIG. 2. In operation of that portion of the air track associated with the diagram, a wafer 14 is stopped on swivelator 30b and rotated clockwise 90°. Swivelator 30b is now rotated downwardly to the dash line 31 position of the diagram in FIG. 2 so as to place the swivelator and the wafer in the same angular position as inclined section 28. Once in this position, the wafer 14 is moved up the inclined section 28 to swivelator 30a where the wafer 14b is stopped and swivelator 30a is rotated upwardly to the horizontal position as shown by the line 32 of the diagram of FIG. 2 so as to place the swivelator and the wafer in the plane of the horizontal air track 25a. Now the wafer is at the elevation of the semiconductor processing station 21 and is moved via the air track to the station for processing.

In a similar manner, wafers are transported out of station 21 down the inclined section 29 and over to processing station 20. As shown in FIG. 2, swivelators 30a function only to transpose the wafers between horizontal and angular positions, whereas swivelators 30b and the remaining swivelators in FIG. 2 also function as orientators and are capable of changing the direction of movement of the wafers. Sections of air track which function solely as direction orientators are well known in the art as shown and described in U.S. Pat. No. 4,165,132 and in an article entitled "Air Film System for Handling Semiconductor Waferes", IBM Journal of Research and Development, Vol. 23, No. 4, July 1979 are those sections of the air track in FIG. 2 numbered 35.

Air track 15, as shown in FIG. 1 and air track 22-29, as shown in FIG. 2, are preferably an axiradial type as described in U.S. Pat. Nos. 4,081,201, 4,165,132 and the above-referenced article. That is, the air track preferably is one constructed with its surface containing rows of long air feed nozzles disposed at angles $\theta$ and $\beta$ so that air velocity components in a direction normal (n) to and in a planar direction, parallel (a) and perpendicular (5), to the track's longitudinal axis, are obtained. The nozzles are separated by evacuating channels and such an air track configuration creates a Coanda effect in conjunction with the axi-radial phenomenon as described in the above-mentioned U.S. Patents and article. These effects, associated with a wafer moving on an inclined axi-radial track, are depicted in FIG. 3a with regard to resultant acting forces, and in FIG. 3b relative to the associated constituent force components. Basically, the wafer 14 of weight W is subjected to an average force $F_s$ due to the combined suction effects of the film holes in the control volume or, in other words, the air volume under the wafer. This force acts in a normal direction n and is opposed by the sum of normal momentum force components of the film hole flows, namely $\Sigma$ $P_n$, and the normal weight component, namely $W_n$. The dynamic equilibrium condition, at the film thickness h, is thus, $\Sigma P_n - W_n - F_s = 0$. This equation can also be written as $\Sigma (P_{cos}\Phi') - W_{cos}\Phi - F_s = 0$ wherein P is the resultant force acting on the wafer; the angle $\Phi$ is the inclination of the air film holes in the direction of travel relative to the normal or n-direction; the angle $\theta$ is the angle of inclination of the air track relative to horizontal; and the angle $\Phi'$ of P with respect to the normal (n) is greater than $\Phi$ by an amount $\delta\Phi$ which reflects the effects of frictional shear forces on the wafer surface. The variation of the air film thickness h with flow rate holds for any value of $\Phi$ (viz., $0 \leq \theta \leq -\pi$). In addition, h remains uniform (i.e.—the wafer remains parallel to the air track surface) at any value of $\theta$ so that, when the angle $\theta$ is = to 0 or the air track is horizontal, $F_s = \Sigma P_n - W$; when the angle $\Phi$ is = to $\pi/2$ or the air track is vertical, $F_s = \Sigma P_n$; and when the angle $\Phi$ is = to $-\pi$ or the air track is horizontal but upside down, $F_s = \Sigma P_n + w$. Thus, as $\theta$ is increased from 0 to $-\pi$ the attraction loading $F_s$ must increase correspondingly. For a given supply flow rate $F_s$ increases automatically with $\theta$ due to the intrinsic compensating mechanisms operative in the air flow field.

However, if the given flow rate is insufficient, a value of $\theta$ will be reached where $F_s$ will not be adequate to hold the wafer on the track. Because $F_s$ increases more than $P_n$ with an increase in flow rate, the wafer can be held on the track for any value of $\theta$ by merely predetermining the necessary flow rate to hold the wafer on the air track at the most critical value of $\theta$. Accordingly, the flow rate for the swivelator 30 is sufficient to hold the wafer when it is in an angular position from the horizontal which gives it its greatest value of $\theta$.

Referring to FIG. 3b, the sum of the force components in the parallel or a-direction, $R_a$, is equal to the $\Sigma$ $P_a - W_a$, $R_a$ or $\Sigma (P_{sin} \Phi') - W_{sin} \theta = R_a$. The resultant force, $R_a$, varies from a maximum at $\theta = 0$, or the air track being in a horizontal position to a minimum at $\theta = \pi/2$, or with the air track in the vertical position when the wafer is moving in an axial direction. Thus, when $\theta = 0$, $R_a = \Sigma (P_{sin} \Phi')$, and when $\theta = \pi/2$, $R_a = \Sigma (P_{sin} \Phi') - W$. Accordingly, in order to have upward movement of the wafer on the air track, $\Sigma (P_{sin \Phi'})$ must be $> W$. This is achieved by increasing the flow rate in the swivelator 30 when upward motion is required in a stationary inclined section of air track, the flow rate for upward motion can be predetermined and thereby preset. The condition $\Sigma (P_{sin \Phi'})$ being $> W$ can also be achieved by increasing the film hole angle $\Phi$ to a greater value as long as it exceeds compatibility with the force components operating in the normal or n direction. It will be understood that the force conditions described in FIGS. 3a and 3b occur simultaneously. Therefore, if the flow rate is increased to insure the proper component forces in the normal or n-direction for a critical inclination angle $\theta$ to hold the wafer on the air track, the value of $R_a$ also is increased for axial wafer movement. From this it can be seen that the component forces in both the n-direction and the a-direction complement rather than compete with each other as the angle $\theta$ is increased from 0 or, in other words, when the swivelator 30 is rotated from its horizontal position.

Normally, the swivelator 30 of the present invention is used to transport objects, herein semiconductor wafers, to manufacturing processing stations at different elevations as shown in FIG. 2. However, there are occasions when it is required to orientate the object, herein the wafer, to a position other than 90° or less, on either side of the horizontal. This is the preferred operating range for the swivelator embodiment shown in FIG. 2, although it is capable of operating beyond 90° of horizontal. To enable the swivelator of the present invention to operate through 360°, an alternate embodiment of the swivelator 30 is shown in FIGS. 4a, and 4b, in which the means 40 for rotating the swivelator is in the center of the swivelator so that the rotational axis 41 is equally distance from either end of the swivelator. In FIG. 4a, the wafer 14 is centered on the swivelator which is in a horizontal orientation and which is rotatable either clockwise or counterclockwise a full 360° around its axis 41. For example, when the swivelator 30 is rotated to where θ is 90°, the swivelator and the wafer 14 thereon are in a vertical position. When the swivelator 30 is rotated to where θ is 180°, the swivelator and the wafer 14 thereon are in an upside-down position. The operation of the swivelator hinged at its center is shown in FIG. 4b positioned halfway between two horizontal sections of air track 42a, 42b and two vertical sections of air track 43a, 43b. These sections of air track are depicted with the air film adjacent the arrows showing the direction of movement of the wafer. That is, in describing the travel of the wafer with the solid arrows 44, the air film is understood to be on the side of the solid arrows and in describing the travel of the wafer with the dashed arrows 45, the air film is understood to be on the side of the dashed arrows. Accordingly, the wafer being transported on the section of air track in the direction of the solid arrow to the swivelator 30 which is horizontal (θ=0) and aligned with the air track 42a, 42b. After the wafer is centered on the seivelator 30, the swivelator is rotated to a vertical position (θ=90°) and aligned with the sections of air track 43a, 43b. Now, the wafer can be transported either up the air track 43a as shown by the direction of the solid arrow 44 or transported downwardly on the air track 43b as shown by the direction of the solid arrow 44. Instead, the swivelator can be rotated to an upside down position (θ=180°) and aligned with the air track 42a, 42b. Now the wafer can be transported on the air track 42b in an upside down orientation in the direction of the solid arrow 44. Alternatively, if the swivelator 30 is rotated in a counterclockwise direction rather than a clockwise direction as shown by the dashed line 30d, the wafer shown by the dashed line arrows 45 can be transported in the direction of the dashed line arrows when the swivelator is aligned with the desired air track in a similar manner as described relative to the solid line arrows.

Figure 5A:
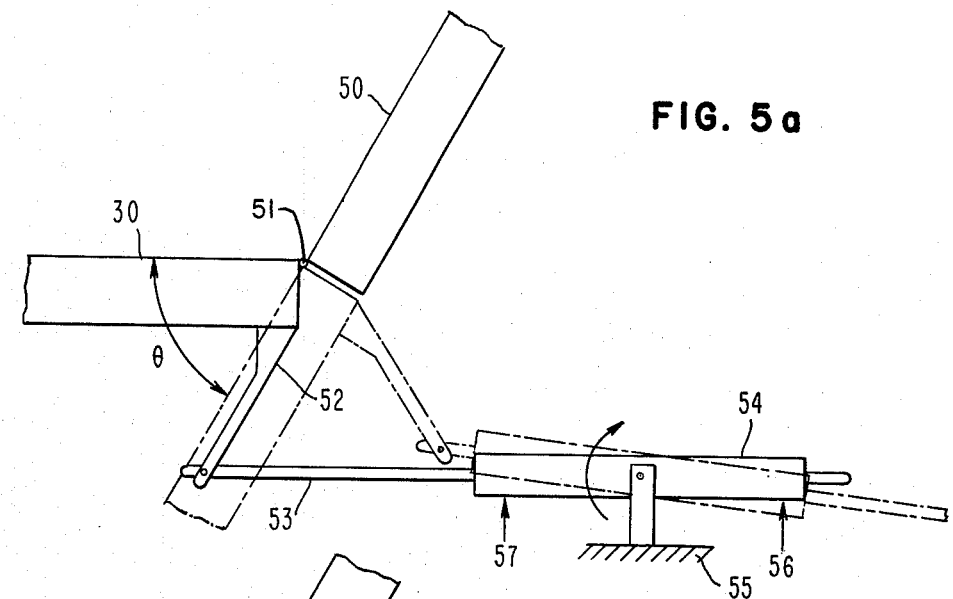
FIG. 5a is a side view of the swivelator of the present invention rotatable about the end axis of an air track in a horizontal orientation, as shown in FIG. 2.
Figure 5B:
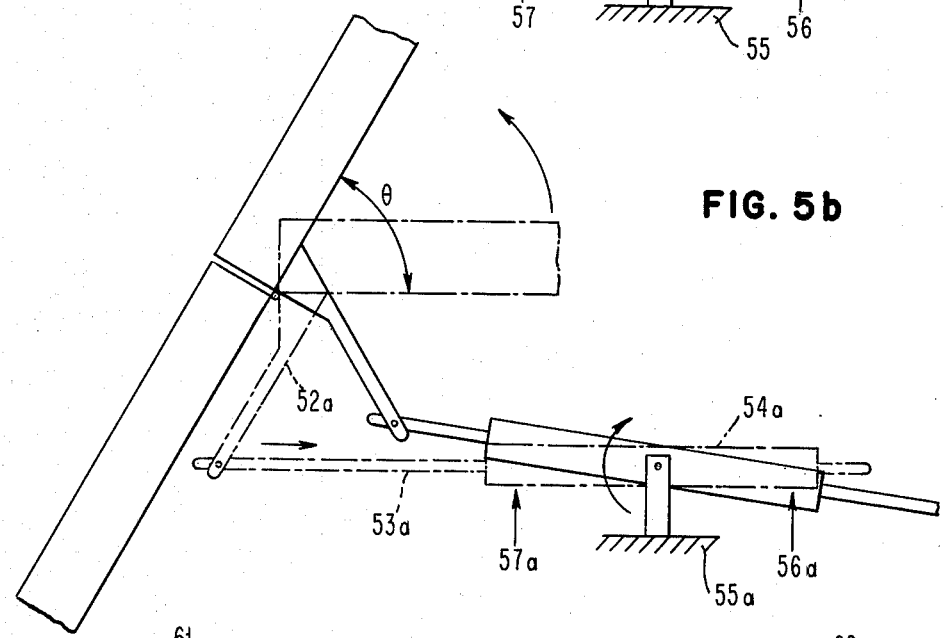
FIG. 5b is a side view of the swivelator of the present invention rotatable about the end axis of an air track in an inclined orientation, as shown in FIG. 2.

To further understand the preferred means for rotating the swivelator 30, as shown in FIG. 2, details of such a mechanism is shown in FIGS. 5a and 5b. In FIG. 5a, the swivelator's normal position is horizontal and its end adjacent to an inclined portion of air track 50 is hinged there to rotate about the axis 51. In the present instance, a fixed extension rod 52 extends downwardly from the swivelator 30 and is pinned to an actuator rod 53 of a commercially available air cylinder 54 pivotly mounted to the frame 55 of the air track. Air ports, as shown by arrows 56, 57, supply and release air to their respective chambers (not shown) on either side of a piston (not shown) within the cylinder. To place the swivelator 30 in its normal horizontal position as shown in FIG. 5a, air is supplied to port 56 and released from port 57 shown so as to cause the piston and the activating rod 53 to the left and place the cylinder 54 in a horizontal position. This motion is translated to the swivelator 30 through the fixed rod 52. To rotate the swivelator 30 in line with the inclined portion of the air track 50, air is supplied to port 57 and released from port 56 so as to cause the piston and the actuating rod 53 to the right. This causes the cylinder 54 to pivot upwardly slightly and pull the swivelator 30 downwardly into alignment as shown by the dashed lines.

When the swivelator's normal position is inclined as shown in FIG. 5b, the same mechanism as described in FIG. 5a is used, but it is mounted with the hinge on the underside of swivelator 30, and it operates in the reverse from that described in FIG. 5a. That is, with the swivelator 30 in its normal inclined position, the piston is in position on the right side of the cylinder 54a, and to move out of the inclined position, the piston is moved to the left.

Figure 6:
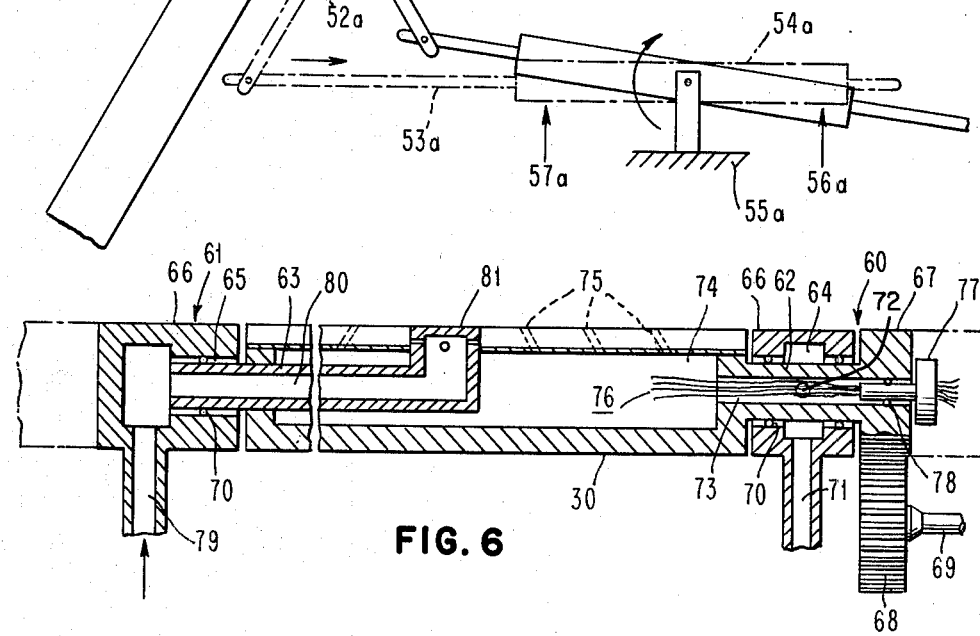
FIG. 6 is a cross sectional view of the swivelator of FIGS. 4a and 4b, taken along the center axis of the swivelator.

If desired to rotate the swivelator 30 about its center axis as shown in FIGS. 4a and 4b and as described as an alternative embodiment, the means for rotating the swivelator can take the form shown as a cross section in FIG. 6. Each end 60, 61 of the swivelator 30 is formed with shafts 62, 63 respectively, journaled into holes 64, 65 respectively in the air track 66. Herein, rigid with shaft 62 is a gear 67 in toothed contact with drive gear 68. Rotatable motion is supplied to gear 67 and the swivelator 30 from a motor (not shown) attached to shaft 69 of drive gear 68. O rings 70 surround the shaft and provide a seal for the air being supplied to the interior of the swivelator 30. Herein, a supply port 71 communicates, through holes 72 in the driven shaft 62 and hollow portion 73 of the shaft 62, with plenum 74 to supply air to film holes 75. Extending through the hollow portion 73 are wires 76 for an electro-optic sensor device (not shown, but described in U.S. Pat. No. 3,165,132) for detecting the presence of an object, herein semiconductor wafer. The wires 76 are stationary during rotation of the swivelator 30 because they are rigid with a fixed plug 77 with a rotary seal 78. The plug 77 seals the hollow gear end 67 of the driven shaft 62. Another supply port 79 supplies air, through the hollow portion 80 of shaft 63, to the aspirator 81.

Figure 7:
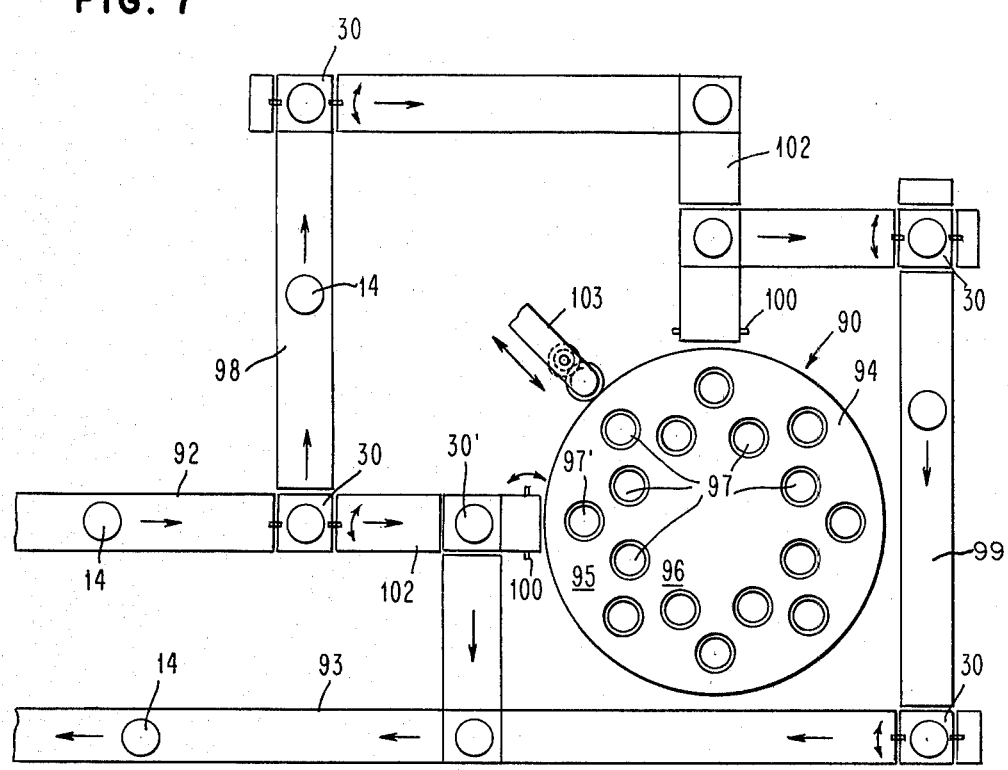
FIG. 7 is a plan view of a vacuum station in semiconductor manufacturing processing line employing the air film transportation system with the swivelators of FIG. 6 and multifunctional swivelators.

An application of the swivelator 30 of the present invention is shown in FIG. 7, in which objects, herein semiconductor wafers 14, are transported into and out of a vacuum vapor deposition manufacture station 90 with its cover 91 (FIG. 8) removed. Air track 92 moves the wafers 14 to station 90 and air track 93 moves processed wafers away as shown by the arrows. Because the dome 94 of the station 90 is formed with a first level 95 and second level 96 of wafer receptacles 97, it is necessary to construct the air track with two levels and connecting incline portions 98 and 99. At each end of the incline portions 98, 99 are the swivelators 30 of the present invention in the embodiment of FIGS. 4a, 4b and 6 for transporting the wafers between a horizontal position and the incline position, as previously described. To place the wafers in and take the wafers out of the receptacles 97, a special swivelator 30' is used and its best shown in FIG. 8. This embodiment 30' of the swivelator 30 is mounted on a pivot 100 and contains a piston 101 movable perpendicular to the surface of the swivelator 30'. When the swivelator 30' is aligned with the air track 102, the piston 101 is retracted or in its home position and flush with the surface of the swivelator 30'. After an object, herein a wafer, is received on the swivelator 30', the swivelator is swung about the pivot 100 to bring the wafer adjacent and parallelly aligned with the receptacle 97'. The piston 101 now is activated and it is moved past the surface of the swivelator to place the wafer 14' in contact with the receptacle 97'. The air supply to the swivelator 30' is momentarily shut off to release the wafer from the swivelator. When this is completed, the piston 101 is retracted to its home position and the swivelator 30' is pivoted back into alignment with the air track to receive the next wafer. The dome 94 is indexed by the retractable drive gear 103 (FIG. 7) to bring the next receptacle into position for loading. When all of the receptacles 97, or those desired, have been loaded, the dome cover 91 is moved down to seal the dome in a chamber for evacuation. After the wafers have been vapor deposited with the desired material, the dome cover is moved upward out of the way of the swivelator 30' which unloads the processed wafers in a manner just the reverse from the above-described loading.

Figure 8:
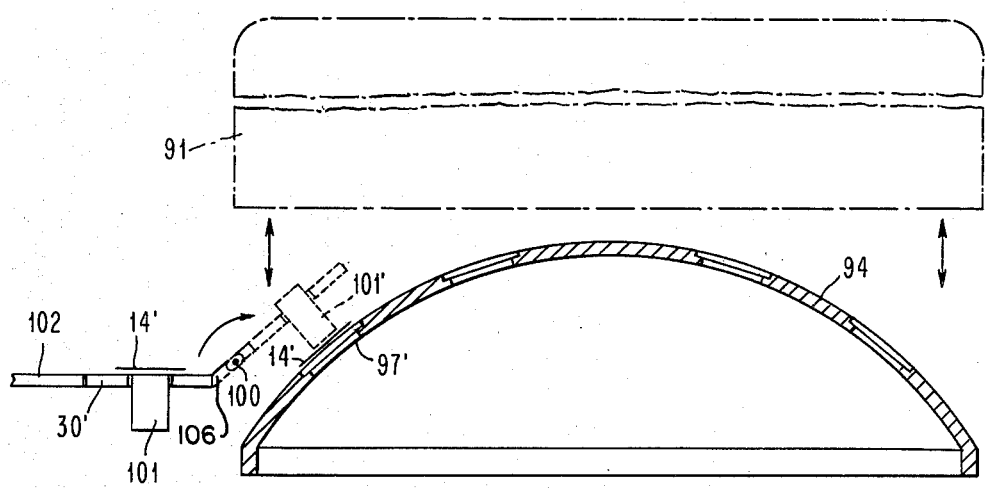
FIG. 8 is a partial cross sectional view of the vacuum station of FIG. 7 showing the operation of the multifunctional swivelator.
Figure 9A:
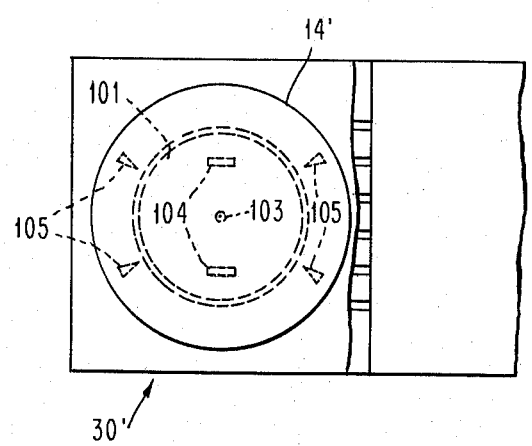
FIG. 9a is a plan view of the multifunctional swivelator with the top partial cut away to show the interior.
Figure 9B:
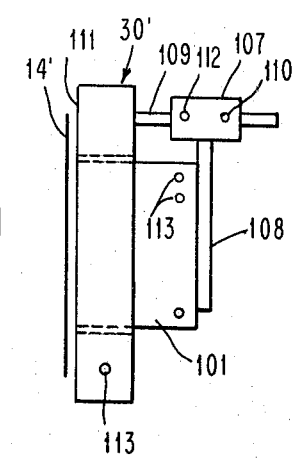
FIG. 9b is a side view of the multifunctional swivelator showing the mechanism for performing one of the functions.

To better understand the embodiment 30' of swivelator 30, FIGS. 9a and 9b show the details of this embodiment. In the plan view of FIG. 9a is shown sensor 103, aspirators 104, and driver jets 105 for sensing, centering, and orienting the wafer 14. In the present instance, the sensor 103 and the aspirators 104 are part of the piston 101, whereas the driver jets 105 are not. Rigid with the swivelator 30' is an extension 106 connected to pivot 100 (FIG. 8). To permit movement of the wafer 14 away from and back to the surface of the swivelator 30', an air cylinder 107 is attached by an arm 108 to the underside of the piston 101. Rod 109 of the air cylinder 107 is fixed to the underside of the swivelator 30' so that when air is supplied to port 110, the cylinder 107 is forced up the rod 109, thereby causing the piston 101 through the action of the arm 108 to move beyond the surface 111 of the swivelator and left of the wafer 14'. When air is supplied to port 112, the cylinder is forced down the rod 109 and retracts the piston 101 back to its home position in alignment with the surface 111. Ports 113 supply air to the conventional ports of the air track, such as the aspiration 104 (FIG. 9a) and driver jets 105 (FIG. 9a).

Figure 10A:
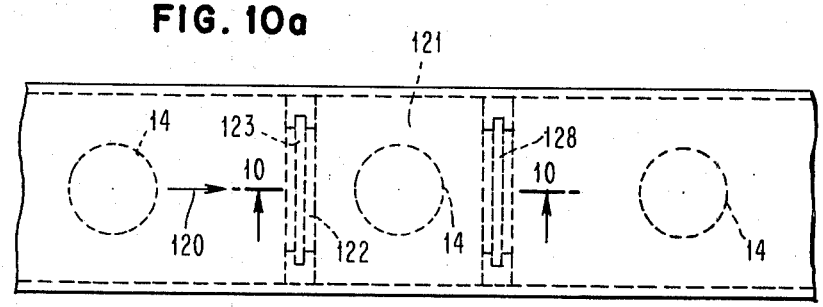
FIG. 10a is a plan view of the gas lock of the present invention.
Figure 10B:
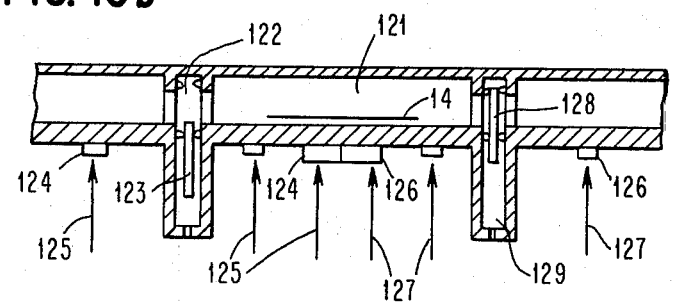
FIG. 10b is a cross sectional view taken along line 10—10 of FIG. 10a showing the gas lock of the present invention.

As mentioned relative to the description of FIG. 1, gas locks 16a-d are positioned in the air track 15 in between the processing stations. The design and mechanisms of these gas locks are well known in the art, so that a detailed description of such gas locks is not deemed necessary, and only a functional description of how such gas locks operate in the manufacturing processing line shown in FIG. 1 will be provided. Turning to FIG. 10a, wafer 14 traveling in the direction of the arrow 120 enters the chamber 121 through gas lock passage 122, whose door 123 is in the open position as shown in FIG. 10b. The gas flow controlling the movement of the wafer 14 into the chamber 121 is associated with the gas of the previous processing station and is supplied through port 124, as shown by the arrows 125. The presence of the wafer in the chamber 121 is sensed and the wafer is stopped by using a track design similar to that shown in the cited references. After the wafer is in the chamber, the door 123 is closed (this position is not shown) and the chamber is evacuated to exhaust the gas from the previous stations and any contaminants resulting therefrom. Following the flushing of the chamber 121 the control of the section of the air track in the chamber and, of course, the air track which will carry the wafer to the next station is put under the control of an air flow associated with the gas of the next processing station through supply ports 126 as shown by the arrows 127. Next, gas lock door 128 is opened by moving it down into the recess 129 shown in FIG. 10b. The wafer has now moved out of the chamber 121 and transported to the next processing station, after which the gas lock door 128 is moved back to the close position as shown in FIG. 10b in preparation for the chamber to receive the next wafer. By incorporating the gas locks in the manufacturing processing system of the present invention, gas contaminants from the environment of one processing station is prevented from flowing to another processing station and yet the wafers are permitted to move from one processing station to the next without seriously degrading the throughput of the manufacturing process. Instead, there is a substantial enhancement in the yield of the object being manufactured.

From the above description of the embodiments of the present invention, it should be obvious to those skilled in the art that many changes can be made in the above embodiments of the invention without departing from the spirit of the invention and the scope of the claims.

Having thus described our invention, what we claim as new, and desire to secure by Letters Patent is:

1. A manufacturing system comprising:
   (a) at least two processing stations for performing processing steps on an object being manufactured;
   (b) an air track creating a film of air, on the underside of said object, and with force components capable of both holding the object off of said track and moving the object along the track, and extending between said two processing stations for transporting the objects from one station to the other station, the operating level for processing the object in one station being either at a different elevation than the other station, or requires an angular orientation different from the other station, said air track having two sections of different angular orientation relative to each other;
   (c) an air track swivelator positioned between said two sections and having a pivot essentially centrally located in the planes of the two sections and normal to the path of the object being transported and being capable of being rotated 360° about said pivot, said swivelator comprising a sensor for detecting the presence of an object and a plurality of air jets for stopping the object, when detected, for attracting the object toward, but out of contact of, the surface of the swivelator during rotation, and for moving the object in either a forward or reverse direction after rotating the swivelator a predetermined number of degrees; and
   (d) means operable for providing an air flow so as to stop and hold said object on the air film, while said swivelator is rotated, and to move the object after rotation, whereby the object is moved from said one section of air track to said other section.

2. The manufacturing system of claim 1 wherein the means for rotating said swivelator portion of the air track is operable in both a clockwise and counterclockwise direction.

3. The manufacturing system of claim 1 wherein said swivelator portion is formed of axi-radial air track.

4. The manufacturing system of claim 1 wherein a gas lock is positioned between said two processing stations, and wherein the portion of the air track for moving the object between the processing stations is under the control of the air flow associated with the gas of the processing station to which the object is being moved.

5. The manufacturing system of claim 1 wherein at one end of at least one air track section adjacent a processing station, is a rotatable air track operable to rotate into and out of the plane of the air track and having a center portion movable essentially normal to the plane of the air track, whereby the movable portion is operable to be moved out of the plane of the rotatable air track which is operable to be rotated to a position at the processing station to either deposit or pick up an object at the station.

6. The manufacturing system of claim 1 wherein the air track swivelator comprises said sensor, and said plurality of air jets on both sides of the swivelator.

* * * * *